United States Patent [19]

Poliniak et al.

[11] 4,153,741
[45] May 8, 1979

[54] METHOD FOR FORMING A SURFACE RELIEF PATTERN IN A POLY(OLEFIN SULFONE) LAYER

[75] Inventors: Eugene S. Poliniak, Willingboro; Nitin V. Desai, Edison, both of N.J.

[73] Assignee: RCA Corporation, New York, N.Y.

[21] Appl. No.: 710,133

[22] Filed: Jul. 30, 1976

[51] Int. Cl.² ............................................. B05D 3/06
[52] U.S. Cl. ...................................... 427/38; 427/43; 427/273; 96/35.1; 96/36.2; 96/115 R
[58] Field of Search ........ 204/192 E, 192 EC, 159.22; 427/43; 96/35.1, 36.2, 115 R; 427/38, 39, 41

[56] References Cited

U.S. PATENT DOCUMENTS

| 3,615,956 | 10/1971 | Irving et al. | 156/646 |
|---|---|---|---|
| 3,799,777 | 3/1974 | O'Keefe et al. | 96/36.2 |
| 3,884,696 | 5/1975 | Bowden et al. | 96/35.1 |
| 3,964,409 | 6/1976 | Himics et al. | 96/36.2 |

Primary Examiner—John H. Newsome
Attorney, Agent, or Firm—H. Christoffersen; Birgit E. Morris; Allen Bloom

[57] ABSTRACT

This invention pertains to an electron beam resist method for forming a surface relief pattern in a poly(olefin sulfone) layer wherein the polymer layer is useful as a sputter etch mask for transferring the surface relief pattern into a metal layer. The surface relief pattern is formed using poly(3-methyl-1-cyclopentene sulfone) as the poly(olefin sulfone) layer and using a mixture of 2-methylcyclohexanone and 2-methylcyclohexanol or a mixture of benzene and 2-methylcyclohexanol as the developer for the poly(3-methyl-1-cyclopentene sulfone) layer.

12 Claims, 5 Drawing Figures

METHOD FOR FORMING A SURFACE RELIEF PATTERN IN A POLY(OLEFIN SULFONE) LAYER

CROSS REFERENCES TO RELATED APPLICATIONS

This application is related to copending application entitled "Method of Transferring a Surface Relief Pattern from a Poly(olefin sulfone) Layer to a Metal Layer" by E. S. Poliniak, N. V. Desai, and R. J. Himics Ser. No. 710,184, filed July 30, 1976 now U.S. Pat. No. 4,045,318; to copending application entitled "Method of Transferring a Surface Relief Pattern from a Wet Poly(olefin sulfone) Layer to a Metal Layer" by E. S. Poliniak and N. V. Desai, Ser. No. 710,134, filed July 30, 1976, now U.S. Pat. No. 4,126,712 issued Nov. 21, 1978; and to copending application "Method for Forming a Shallow Surface Relief Pattern in a Poly(olefin sulfone) Layer" by E. S. Poliniak and N. V. Desai, Ser. No. 710,135, filed July 30, 1976, which applications are concurrently filed and are herein incorporated by reference.

BACKGROUND OF THE INVENTION

Transferring surface relief patterns from poly(olefin sulfone) layers to metal layers by sputter etching has been described in the above mentioned copending application entitled "Method of Transferring a Surface Relief Pattern from a Poly(olefin sulfone) Layer to a Metal Layer" by E. S. Poliniak, N. V. Desai, and R. J. Himics and copending application entitled "Method of Transferring a Surface Relief Pattern from a Wet Poly(olefin sulfone) Layer to a Metal Layer" by E. S. Poliniak and N. V. Desai and described by M. J. Bowden and L. G. Thompson in the *Journal of the Electrochemical Society*, 121 1620 (1974). When these methods are employed, a surface relief pattern is first formed in the poly(olefin sulfone) layer generally by an electron beam resist process. To rapidly form the surface relief pattern in the poly(olefin sulfone) layer and to accurately transfer the surface relief pattern to the metal layer, the poly(olefin sulfone) layer must be responsive to low levels of electron beam exposure and form well defined surface relief patterns. While the formation of surface relief patterns in poly(olefin sulfone) layers has been described generally in U.S. Pat. No. 3,893,127 to Kaplan et al and in U.S. Pat. No. 3,935,331 to Poliniak et al and the use of preferred developers for poly(1-methyl-1-cyclopentene sulfone) has been described in U.S. Pat. No. 3,935,332 to Poliniak et al, the use of more sensitive poly(olefin sulfones) which form well defined surface relief patterns suitable for sputter etching has been sought.

SUMMARY OF THE INVENTION

It has been found that forming a surface relief pattern in a poly(3-methyl-1-cyclopentene sulfone) layer by exposing the poly(3-methyl-1-cyclopentene sulfone) layer to a modulated beam of electrons and developing the poly(3-methyl-1-cyclopentene sulfone) layer with a mixture of 2-methylcyclohexanone and 2-methylcyclohexanol or a mixture of benzene and 2-methylcyclohexanol produces deep, sharp-edged and straight-walled surface relief patterns with no erosion of the poly(3-methyl-1-cyclopentene sulfone) layer and with very low electron beam exposure levels. These well defined surface relief patterns provide for excellent sputter etch masks for transferring the surface relief patterns into metal layers.

DETAILED DESCRIPTION OF THE INVENTION

Figure 1:
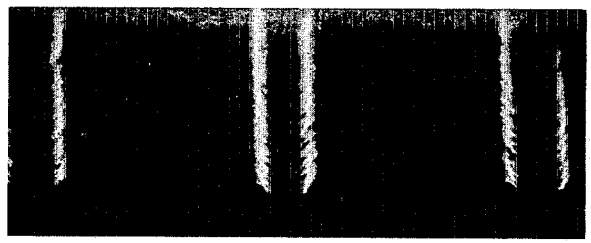
FIGS. 1 – 5 are photomicrographs of surface relief patterns formed in poly(olefin sulfone) layers.

Poly(3-methyl-1-cyclopentene sulfone) having a molecular weight of about 500,000 to about 3,000,000 and preferably about 2,000,000, is dissolved in a solvent, coated from solution onto a metal layer, and formed into a polymer layer about 0.3 to 1.0 micron thick by well known techniques such as spinning, brushing, dipping, and the like. The solvent may then be removed by baking or vacuum drying the polymer layer. Surface relief patterns are formed in the poly(3-methyl-1-cyclopentene sulfone) polymer layer by exposing the polymer layer to a modulated beam of electrons and contacting the polymer layer with a solvent developer. Although the exact mechanism of recording is not known, it is believed the electron beam degrades the $-SO_2-C-$ linkage. This changes the solubility characteristics of the polymer so that, for positive acting polymers, contact with the developer dissolves the exposed portions of the layer more rapidly than the unexposed portions.

Additional details for preparing poly(3-methyl-1-cyclopentene sulfone) layers on metal layers and recording surface relief patterns thereon are described in the above mentioned U.S. Pat. No. 3,893,127 to Kaplan et al, and U.S. Pat. Nos. 3,935,331 and 3,935,332 to Poliniak et al which are incorporated herein by reference.

According to the present invention, poly(3-methyl-1-cyclopentene sulfone) is utilized as the poly(olefin sulfone) layer for forming the surface relief pattern by electron beam resist and the surface relief pattern is developed with a mixture of 2-methylcyclohexanone and 2-methylcyclohexanol or a mixture of benzene and 2-methylcyclohexanol. Preferred mixtures are 50 percent by weight of 2-methylcyclohexanone and 50 percent by weight of 2-methylcyclohexanol or 15 percent by weight of benzene and 85 percent by weight of 2-methylcyclohexanol. Utilizing and developers of the present invention with a poly(3-methyl-1cyclopentene) layer, surface relief patterns can be formed with electron beam exposures as low as 0.5 microcoulombs/cm$^2$ or less, which allows for rapid electron beam scanning. At a 0.5 microcoulomb/cm$^2$ exposure, surface relief patterns can be formed with scanning speeds of 125 cm/sec. employing a 10 kilovolt — 3 nanoampere modulated electron microscope emitting a Gaussian shaped beam. The indentations of the surface relief patterns formed under these conditions will penetrate completely through a 1.0 micron thick layer of poly(3-methyl-1-cyclopentene sulfone) and produce a surface relief pattern with sharp edges, straight walls and with no erosion of the unexposed polymer layer.

While there are numerous poly(olefin sulfones) and numerous possible developers, only poly(3-methyl-1-cyclopentene sulfone) used with the developers of the present invention, have been found to produce surface relief patterns which exhibit the above described properties at low electron beam exposure levels.

After formation of the surface relief pattern in the polymer layer, the surface relief pattern is transferred to the metal layer in contact with the polymer layer by bombarding the layers with ions which causes the removal of materials from the bombarded surface. The bombardment is continued until the poly(3-methyl-1-cyclopentene) layer has been substantially eroded and the surface relief pattern has been etched into the metal layer. The well defined surface relief patterns formed in the poly (3-methyl-1-cyclopentene) layer allows for accurate transfer of surface relief pattern to the metal layer. After bombardment has been completed, any residual polymer is removed by standard techniques such as reactive sputter cleaning or chemical stripping with organic solvents or strong oxidizing agents such as Caro's acid, chromate/sulfuric acid and the like.

The invention will be further illustrated by the following examples but it is to be understood that the invention is not meant to be limited to the details described therein.

EXAMPLE 1

A gold metal layer approximately 2,000 angstroms thick was vapor deposited on a 1.3 cm × 1.3 cm glass slide. A solution of 10 percent by weight poly(3-methyl-1-cyclopentene sulfone) having a molecular weight of 2,000,000, and 90 percent by weight cyclopentanone was spun at a rate of 1,000 rpm onto the gold layer forming a wet polymer layer about 1 micron thick. The polymer layer was covered and allowed to set overnight in order to relieve any stress which may have developed in the layer.

Utilizing a 10 kilovolt — 3 nanoampere modulated scanning electron beam microscope producing a Gaussian shaped beam with an approximate diameter of 0.5 micron, a raster pattern was formed on the polymer layer at a scan speed of 125 centimeters per second. This corresponded to an exposure level of 0.5 microcoulomb/cm$^2$. The polymer layer was then developed by contacting it with a mixture of 50% by weight of 2-methylcyclohexanone and 50% by weight of 2-methylcyclohexanol for five minutes and then rinsing in Freon TF, and spin drying. FIG. 1 is a photomicrograph illustrating the excellent quality of the resultant surface relief pattern with indentations that penetrate to the metal layer.

EXAMPLE 2

Figure 2:
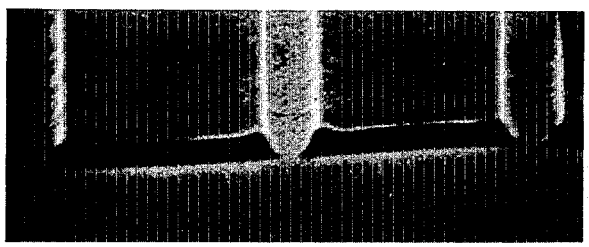

The procedure of EXAMPLE 1 was substantially repeated except that the polymer layer was developed by contacting it with a mixture of 15% by weight of benzene and 85% by weight of 2-methylcyclohexanol for two minutes. FIG. 2 is a photomicrograph showing the excellent quality of the resultant surface relief pattern with indentations that penetrate to the metal layer.

EXAMPLE 3

Figure 3:
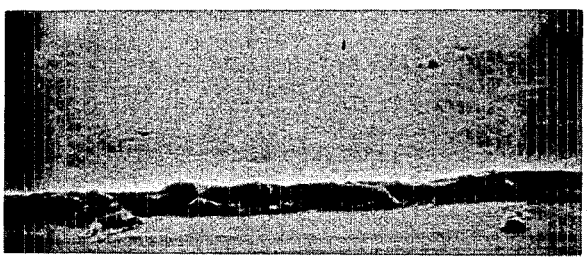

This example is presented as a control. The procedure of EXAMPLE 1 was substantially repeated except that poly(1-methyl-1-cyclopentene sulfone) was used as the polymer layer which was developed with 2-methylcyclohexanone. FIG. 3 is a photomicrograph illustrating that no surface relief pattern was formed at this scan speed.

EXAMPLES 4 – 52

A series of samples was prepared substantially utilizing the procedure of EXAMPLE 1 except the poly(3-methyl-1-cyclopentene sulfone) had a molecular weight of 500,000 instead of 2,000,000. A variety of developers was utilized, and scan speeds of 2.5, 10, 25, and 50 cm/sec. were employed. These speeds correspond to exposure levels of 26.6.7, 2.3, and 1.3 microcoulombs/cm$^2$. The results are recorded in the Table. As the results show, only the mixture of 2-methylcyclohexanone and 2-methylcyclohexanol and the mixture of benzene and 2-methylcyclohexanol produced deep straight-walled, sharp-edged surface relief patterns with no erosion of the polymer layer at scan speeds of 25 cm/sec. The X's in the Table indicate the highest scan speeds at which surface relief patterns were formed.

Figure 4:
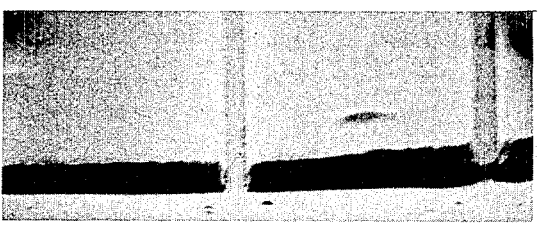
Figure 5:
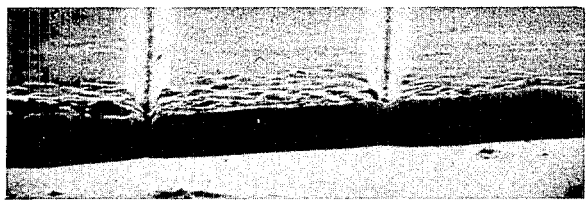

FIG. 4 is a photomicrograph illustrating the excellent quality of the surface relief pattern of EXAMPLE 4. FIG. 5 is a photomicrograph of EXAMPLE 6 exemplifying a shallow surface relief pattern not suitable for sputter etching produced by using a scan speed of 25 cm/sec. and a mixture of 2-methylcyclohexanone and 3-methylcyclohexanol as the developer solvent.

TABLE

| EX. | DEVELOPER | 2.5 (26.0) | 10 (6.7) | 25 (2.3) | 50 cm/sec. (1.3 microcoulomb/cm$^2$) | COMMENTS |
|---|---|---|---|---|---|---|
| 4 | 50% 2-Methylcyclohexanone<br>50% 2-Methylcyclohexanol | | | X | | deep, straight-walled, sharp-edged - no erosion |
| 5 | 15% Benzene:<br>85% 2-Methylcyclohexanol | | | X | | deep, straight-walled, sharp-edged - no erosion |
| 6 | 50% 2-Methylcyclohexanone<br>50% 3-Methylcyclohexanol | | | X | X | shallow indentations |
| 7 | 50% Cycloheptanone<br>50% 2-Methylcyclohexanol | | | X | X | shallow indentations |
| 8 | 2-Methylcyclohexanol | X | | | | insensitive |
| 9 | 4-Methylcyclohexanol | X | | | | insensitive |
| 10 | Cyclopentanol | X | | | | insensitive |
| 11 | 3,3 Dimethyl-2-butanone | | | X | | sloped walls |
| 12 | 2, 6-Dimethyl-4-heptanone | X | | | | insensitive |
| 13 | 3-Methyl-5-hexanone | | X | | | insensitive |
| 14 | 5-Methyl-2-hexanone | | | X | | sloped walls |
| 15 | Isopropanol | X | | | | insensitive |
| 16 | Methyl Cellosolve Acetate | X | | | | insensitive |
| 17 | Methanol | X | | | | insensitive |
| 18 | 3-Methyl-2-butanol | | | | | insensitive |
| 19 | P-Cymene | X | | | | insensitive |

TABLE-continued

| EX. | DEVELOPER | 2.5 (26.0) | 10 (6.7) | 25 (2.3) | 50 cm/sec. (1.3 microcoulomb/cm$^2$) | COMMENTS |
|---|---|---|---|---|---|---|
| 20 | 3-Heptanone | X | | | | sloped walls |
| 21 | 2,4-Dimethyl-3-pentanone | X | | | | insensitive |
| 22 | MethylIsobutyl Ketone | | X | | | sloped walls |
| 23 | 2-Heptanone | | X | | | sloped walls |
| 24 | Isopropyl Acetate | X | | | | sloped walls |
| 25 | Isobutyl Acetate | X | | | | sloped walls |
| 26 | 4-Heptanone | X | | | | insensitive |
| 27 | 1,4-Dioxane | | X | | | sloped walls |
| 28 | Pentyl Acetate | | | X | | high erosion |
| 29 | Isopentyl Acetate | | X | | | sloped walls |
| 30 | 3-Methyl-2-pentanone | | X | | | sloped walls |
| 31 | Carbon Tetrachloride | | X | | | sloped walls |
| 32 | Acetone | | | X | | sloped walls |
| 33 | Chlorocyclohexane | | X | | | sloped walls |
| 34 | Cyclohexyl Acetate | | X | | | insensitive |
| 35 | 3-methylcyclohexanone | | | X | X | sloped walls |
| 36 | 2-Methylcyclohexanone | | | X | | sloped walls |
| 37 | Benzene | | | X | | sloped walls |
| 38 | Acetophenone | X | | | | insensitive |
| 39 | Butylbenzene | | X | | | sloped walls |
| 40 | 2-Methoxyethyl Acetate | | X | | | sloped walls |
| 41 | Ethylbenzene | X | | | | sloped walls |
| 42 | Xylene | X | | | | sloped walls |
| 43 | Cyclohexanone | | X | | | insensitive |
| 44 | Cycloheptanone | | X | | | sloped walls |
| 45 | Cyclopentanone | | X | | | insensitive |
| 46 | Triethylbenzene | | X | | | insensitive |
| 47 | Dimethylsulfoxide | | X | | | insensitive |
| 48 | 2-Octanone | | X | | | sloped walls |
| 49 | 3-Octanone | X | | | | insensitive |
| 50 | 4-Octanone | X | | | | insensitive |
| 51 | 3-Methylcyclohexanol | X | | | | insensitive |
| 52 | 30% Acetonyl Acetate 70% Acetone | | | | | dissolved polymer layer |

What is claimed is:

1. A method for forming a surface relief pattern in a poly(3-methyl-1-cyclopentene sulfone) layer which comprises:
   (a) exposing the polymer layer to a modulated beam of electrons whereby the portions of the polymer layer exposed to the electron beam becomes more soluble in a solvent developer than the unexposed portions; and
   (b) contacting the exposed polymer layer to a solvent developer which is selected from the group consisting of a mixture of 2-methylcyclohexanone and 2-methylcyclohexanol and a mixture of benzene and 2-methylcyclohexanol whereby a surface relief pattern is formed in the polymer layer.

2. A method according to claim 1 wherein the mixture of 2-methylcyclohexanone and 2-methylcyclohexanol is about 50% by weight 2-methylcyclohexanone and about 50% by weight 2-methylcyclohexanol.

3. A method according to claim 1 wherein the mixture of benzene and 2-methylcyclohexanol is about 15% by weight benzene and about 85% by weight 2-methylcyclohexanol.

4. A method according to claim 1 wherein the poly(3-methyl-1-cyclopentene sulfone) has a molecular weight of about 500,000 to about 3,000,000.

5. A method according to claim 1 wherein the poly(3-methyl-1-cyclopentene sulfone) has a molecular weight of about 2,000,000.

6. A method according to claim 1 wherein the poly(3-methyl-1-cyclopentene sulfone) layer is about 1 micron thick.

7. A method for forming a surface relief pattern in a metal layer which comprises:
   (a) exposing a poly(3-methyl-1-cyclopentene sulfone) layer in contact with the metal layer to a modulated beam of electrons whereby the portions of the polymer layer exposed to the electron beam become more soluble in a solvent developer than the unexposed portions;
   (b) contacting the exposed polymer layer to the solvent developer which is selected from the group consisting of a mixture of 2-methylcyclohexanone and 2-methylcyclohexanol and a mixture of benzene and 2-methylcyclohexanol whereby a surface relief pattern is formed in the polymer layer; and
   (c) bombarding the polymer layer with sufficient ions to substantially remove the polymer layer and etch the surface relief pattern into the metal layer.

8. A method according to claim 7 wherein the mixture of 2-methylcyclohexanone and 2-methylcyclohexanol is about 50% by weight 2-methylcyclohexanone and about 50% by weight 2-methylcyclohexanol.

9. A method according to claim 7 wherein the mixture of benzene and 2-methylcyclohexanol is about 15% by weight benzene and about 85% by weight 2-methylcyclohexanol.

10. A method according to claim 7 wherein the poly(3-methyl-1-cyclopentene sulfone) has a molecular weight of about 500,000 to about 3,000,000.

11. A method according to claim 7 wherein the poly(3-methyl-1-cyclopentene sulfone) has a molecular weight of about 2,000,000.

12. A method according to claim 7 wherein the poly(3-methyl-1-cyclopentene sulfone) layer is about 1 micron thick.